United States Patent
Lin et al.

(10) Patent No.: US 10,840,105 B2
(45) Date of Patent: Nov. 17, 2020

(54) GATE STRUCTURE WITH INSULATING STRUCTURE AND METHOD FOR MANUFACTURING THE SAME

(71) Applicant: TAIWAN SEMICONDUCTOR MANUFACTURING CO., LTD, Hsin-Chu (TW)

(72) Inventors: Yu-Hung Lin, Taichung (TW); Hon-Lin Huang, Hsinchu (TW); Rueijer Lin, Hsinchu (TW); Shih-Chi Lin, Hsinchu (TW); Sheng-Hsuan Lin, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/739,379

(22) Filed: Jun. 15, 2015

(65) Prior Publication Data
US 2016/0365343 A1 Dec. 15, 2016

(51) Int. Cl.
*H01L 21/311* (2006.01)
*H01L 21/8234* (2006.01)

(52) U.S. Cl.
CPC ........... *H01L 21/31144* (2013.01); *H01L 21/823468* (2013.01); *H01L 21/823475* (2013.01)

(58) Field of Classification Search
CPC .................................. H01L 21/76224
USPC ........................................ 257/401
See application file for complete search history.

(56) References Cited

U.S. PATENT DOCUMENTS

| | | | | |
|---|---|---|---|---|
| 5,268,330 A | * | 12/1993 | Givens | H01L 21/321 257/E21.3 |
| 5,482,611 A | * | 1/1996 | Helmer | H01J 37/32192 204/192.12 |
| 6,720,213 B1 | * | 4/2004 | Gambino | H01L 21/26506 438/184 |
| 7,989,330 B2 | | 8/2011 | Shima et al. | |
| 2004/0058522 A1 | * | 3/2004 | Lee | H01L 21/76897 438/618 |
| 2006/0267899 A1 | | 11/2006 | Yamazaki | |
| 2006/0281254 A1 | * | 12/2006 | Lee | H01L 29/40114 438/257 |
| 2007/0298572 A1 | * | 12/2007 | Chen | H01L 29/6659 438/294 |
| 2008/0073713 A1 | * | 3/2008 | Kim | H01L 29/7843 257/336 |
| 2009/0250774 A1 | | 10/2009 | Min-Chul et al. | |

(Continued)

FOREIGN PATENT DOCUMENTS

JP 2010-239148 A 10/2010
KR 10-2001-0091723 A 10/2001
(Continued)

*Primary Examiner* — Vongsavanh Sengdara
(74) *Attorney, Agent, or Firm* — Birch, Stewart, Kolasch & Birch, LLP

(57) ABSTRACT

A semiconductor structure and a method for forming the same are provided. The method for manufacturing a semiconductor structure includes forming a gate structure over a substrate and forming a spacer on a sidewall of the gate structure. The method for manufacturing a semiconductor structure further includes forming a hard mask structure on a top surface of the gate structure and on an upper portion of the spacer but not on a bottom portion of the spacer.

20 Claims, 9 Drawing Sheets

(56) References Cited

U.S. PATENT DOCUMENTS

| | | | |
|---|---|---|---|
| 2010/0103518 A1* | 4/2010 | Uejima | G02B 5/3058 |
| | | | 359/485.05 |
| 2010/0270627 A1* | 10/2010 | Chang | H01L 21/28247 |
| | | | 257/411 |
| 2011/0057267 A1 | 3/2011 | Chuang et al. | |
| 2011/0189615 A1* | 8/2011 | Hou | G03F 7/20 |
| | | | 430/313 |
| 2012/0032238 A1* | 2/2012 | Teo | H01L 29/66545 |
| | | | 257/288 |
| 2013/0075796 A1* | 3/2013 | Tsai | H01L 21/823828 |
| | | | 257/288 |
| 2013/0105903 A1* | 5/2013 | Chang | H01L 21/823842 |
| | | | 257/369 |
| 2013/0119487 A1 | 5/2013 | Lin et al. | |
| 2013/0187203 A1 | 7/2013 | Xie et al. | |
| 2013/0328115 A1 | 12/2013 | Chuang et al. | |
| 2013/0344319 A1* | 12/2013 | Zhu | C04B 41/87 |
| | | | 428/335 |
| 2014/0103403 A1* | 4/2014 | Kim | H01L 29/42372 |
| | | | 257/288 |
| 2014/0127893 A1* | 5/2014 | Huang | H01L 29/6653 |
| | | | 438/590 |
| 2015/0126012 A1* | 5/2015 | Jeong | H01L 29/66628 |
| | | | 438/300 |

FOREIGN PATENT DOCUMENTS

| | | |
|---|---|---|
| KR | 10-2009-0107206 A | 10/2009 |
| KR | 10-1044427 B1 | 6/2011 |
| KR | 10-2015-0051720 A | 5/2015 |
| TW | 434908 B | 5/2001 |

* cited by examiner

GATE STRUCTURE WITH INSULATING STRUCTURE AND METHOD FOR MANUFACTURING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
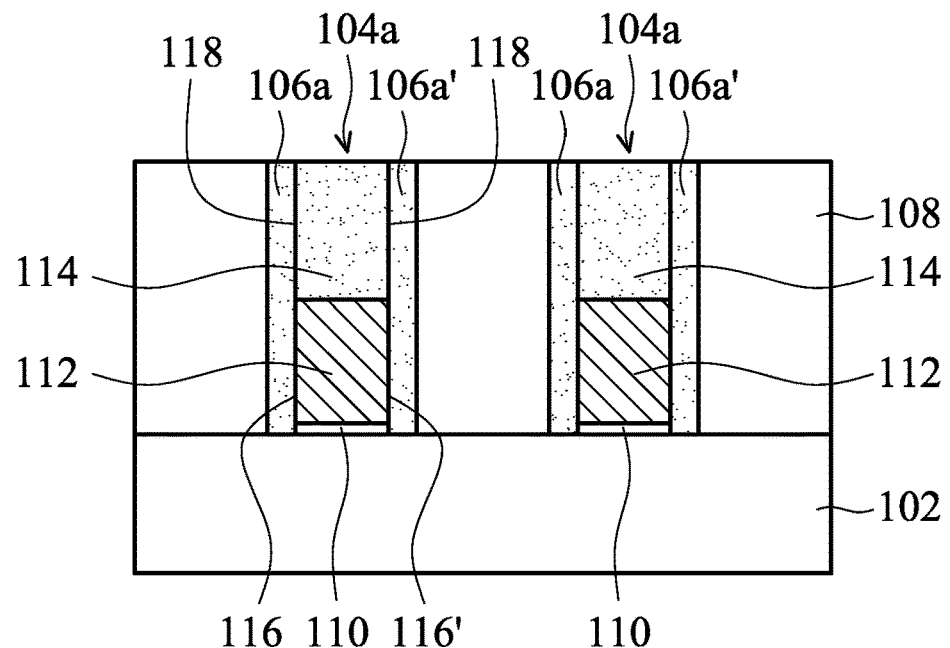
FIGS. 1A to 1F are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for manufacturing the same are provided. The method for forming the semiconductor structure includes forming a hard mask structure over a gate structure to prevent the gate structure from leakage.

FIGS. 1A to 1F are cross-sectional representations of various stages of forming a semiconductor structure 100a in accordance with some embodiments. As shown in FIG. 1A, a substrate 102 is received in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, conductive features, and/or isolation structures. Furthermore, substrate 102 may further include single or multiple material layers to be patterned. For example, the material layers may include a silicon layer, a dielectric layer, and/or a doped poly-silicon layer.

Gate structures 104a are formed over substrate 102, as shown in FIG. 1A in accordance with some embodiments. Gate structure 104 includes a gate dielectric layer 110, a gate electrode layer 112, and an insulating layer 114 in accordance with some embodiments.

In some embodiments, gate dielectric layer 110 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

In some embodiments, gate electrode layer 112 is made of a conductive material, such as aluminum, copper, tungsten, titanium, tantalum, or other applicable materials. In some embodiments, gate electrode layer 112 is made of polysilicon. In some embodiments, gate electrode layer 112 further includes a work function metal layer. The work functional metal layer may be customized to have the proper work function. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used.

After gate structures 104a are formed, a first spacer 106a and a second spacer 106a' are formed over the sidewalls of gate structures 104a, as shown in FIG. 1A in accordance with some embodiments. In some embodiments, first spacer 106a and second spacer 106a' are made of silicon nitride, silicon oxide, silicon oxynitride, silicon carbide, or other applicable dielectric materials. First spacer 106a and second spacer 106a' may include a single layer or multiple layers.

As shown in FIG. 1A, gate structure 104a includes gate electrode layer 112 and insulating layer 114 formed over gate electrode layer 112. In addition, first spacer 106a is formed on a first sidewall 116 of gate electrode layer 112 and a first sidewall 118 of insulating layer 114, and second spacer 106a' is formed on a second sidewall 116' of gate electrode layer 112 and a second sidewall 118' of insulating layer 114'.

Next, an interlayer dielectric layer 108 is formed around gate structures 104a over substrate 102, as shown in FIG. 1A in accordance with some embodiments. Inter-layer dielectric layer 108 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Inter-layer dielectric layer 108 may be formed by chemical vapor deposition (CVD), physical vapor deposition, (PVD), atomic layer deposition (ALD), spin-on coating, or other applicable processes.

Figure 1B:
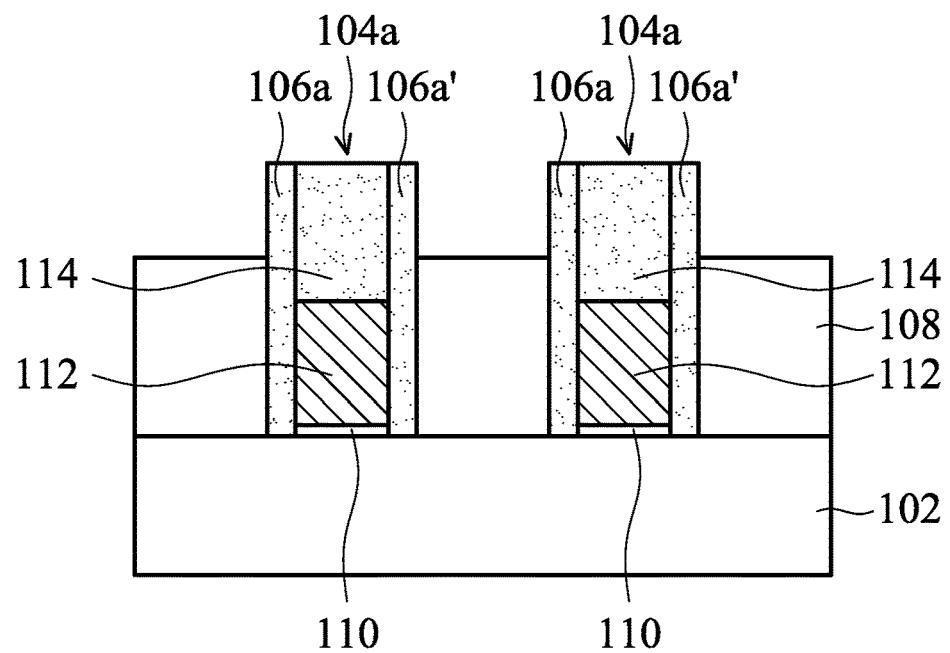

Afterwards, a top portion of interlayer dielectric layer 108 is removed, as shown in FIG. 1B in accordance with some embodiments. In some embodiments, the top portion of interlayer dielectric layer 108 is removed by an etching process. After the top portion of interlayer dielectric layer 108 is removed, an upper portion of gate structure 104a is exposed. More specifically, portions of first spacer 106a, second spacer 106a', and insulating layer 114 are exposed after the top portion of interlayer dielectric layer 108 is removed.

Figure 1C:
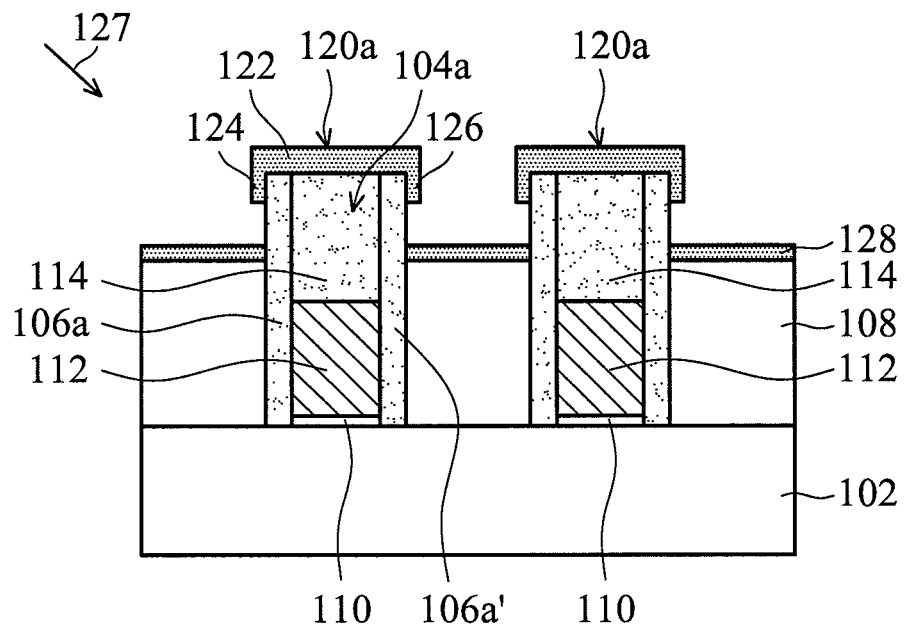

Next, hard mask structures 120a are formed over gate structures 104a, as shown in FIG. 1C in accordance with some embodiments. In some embodiments, hard mask structure 120a includes a main portion 122, a first extending portion 124, and a second extending portion 126. More specifically, main portion 122 of hard mask structure 120a is formed over the top surface of gate structure 104a (i.e. the top surface of insulating layer 114). In addition, first extending portion 124, which is connected to one side of the main portion 122, extends onto the upper portion of first sidewall 106a but not to the bottom portion of first sidewall 106a, and second extending portion 126, which is connected to another side of the main portion 122, extends onto the upper portion of second sidewall 106a' but not to the bottom portion of second sidewall 106a'.

In some embodiments, the length of first extending portion 124 is substantially equal to the length of second extending portion 126. The length of first extending portion 124 may be defined as the length of first extending portion 124 over first spacer 106a measured in a direction perpendicular to the top surface of substrate 102. Similarly, the length of second extending portion 126 may be defined as the length of second extending portion 126 over second spacer 106a' measured in a direction perpendicular to the top surface of substrate 102.

In some embodiments, hard mask structure 120a is made of TiN. In some embodiments, hard mask structure 120a is formed by performing a physical vapor deposition process. In some embodiments, hard mask structure 120a is formed by performing a plasma spray physical vapor deposition process. In some embodiments, plasma 127 is sprayed toward gate structure 104a in a first direction, and an angle between the first direction and the top surface of gate structure 104a is in a range from about 30° to about 85°. When the plasma is sprayed to gate structure 104a in the first direction, which is not vertical to the top surface of substrate 102, the lengths of first extending portion 124 and second extending portion 126 of hard mask structure 120 may be easier to control.

However, it should be noted that the formation of hard mask structures 120a may include other manufacturing processes, and the scope of the disclosure is not intended to be limiting. Hard mask structures 120a are formed with sufficient coverage on gate structures 104a.

In some embodiments, an additional hard mask layer 128 is formed over interlayer dielectric layer 108, as shown in FIG. 1C in accordance with some embodiments. However, the thickness of hard mask layer 128 may be relatively small. In some embodiments, the thickness of main portion 122 of hard mask structure 120a is greater than the thickness of hard mask layer 128.

In some embodiments, the thickness of main portion 122 of hard mask structure 120a is in a range from about 6 nm to about 30 nm. If main portion 122 of hard mask structure 120a is not thick enough, it may not be able to protect gate structure 104a in subsequent etching processes. On the other hand, if main portion of 122 of hard mask structure 120a is too thick, the thickness of hard mask layer 128 formed over interlayer dielectric layer 108 may also be relatively thick, and the formation of the trenches formed through interlayer dielectric layer 108 in subsequent processes may become more difficult.

Figure 1D:
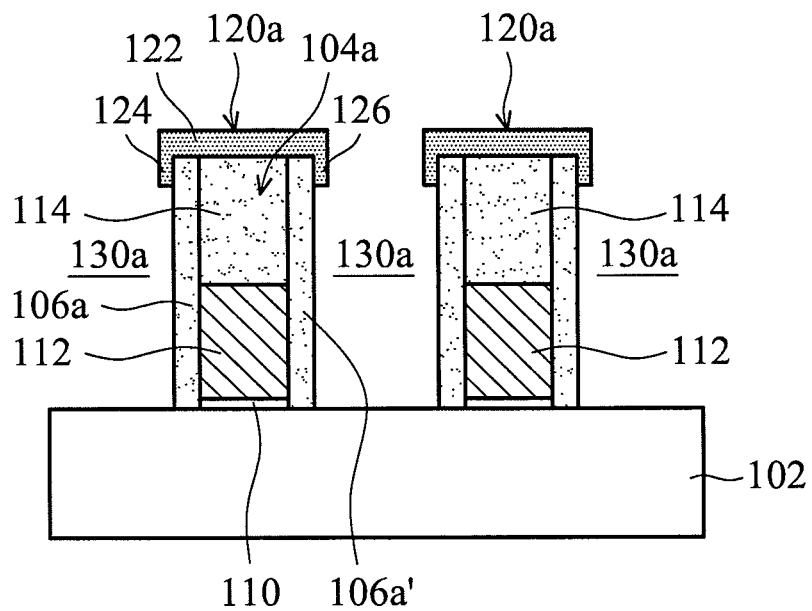

After hard mask structure 120a is formed, portions of interlayer dielectric layer 108 are removed to form trenches 130a, as shown in FIG. 1D in accordance with some embodiments. In some embodiments, trenches 130a are formed by performing etching processes. It should be noted that, although interlayer dielectric layer 108 seems to be completely removed in FIG. 1D, it only shows a cross-sectional representation of the structure. In other portions of the structure, some portions of interlayer dielectric layer 108 are still positioned around gate structures 104a.

Figure 1E:
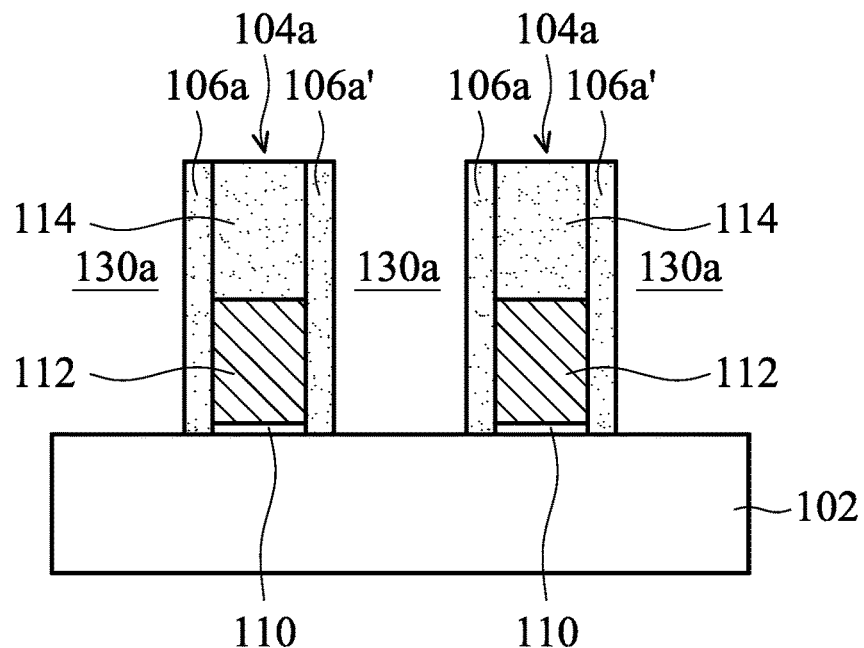

After trenches 130a are formed, hard mask structures 120a are removed, as shown in FIG. 1E in accordance with some embodiments. In some embodiments, hard mask structures 120a are removed by performing an etching process. Afterwards, a silicide layer 132 is formed over the bottom surface of trench 130a, as shown in FIG. 1F in accordance with some embodiments.

Silicide layer 132 may formed by forming a metal layer, performing an annealing process to form a silicide layer, and removing the additional metal layer. More specifically, a metal layer may be formed over the top surface of substrate 102 exposed by trench 130a. The metal layer may be made of Ni, Ti, Al, Sn, Co, Pd, or Pt. After the metal layer is formed, an annealing process may be performed so that the metal layer can react with the top surface of substrate 102. Accordingly, silicide layer 132 may formed by reacting the metal layer and substrate 102. After silicide layer 132 is formed, the unreacted metal layer may be removed.

Figure 1F:
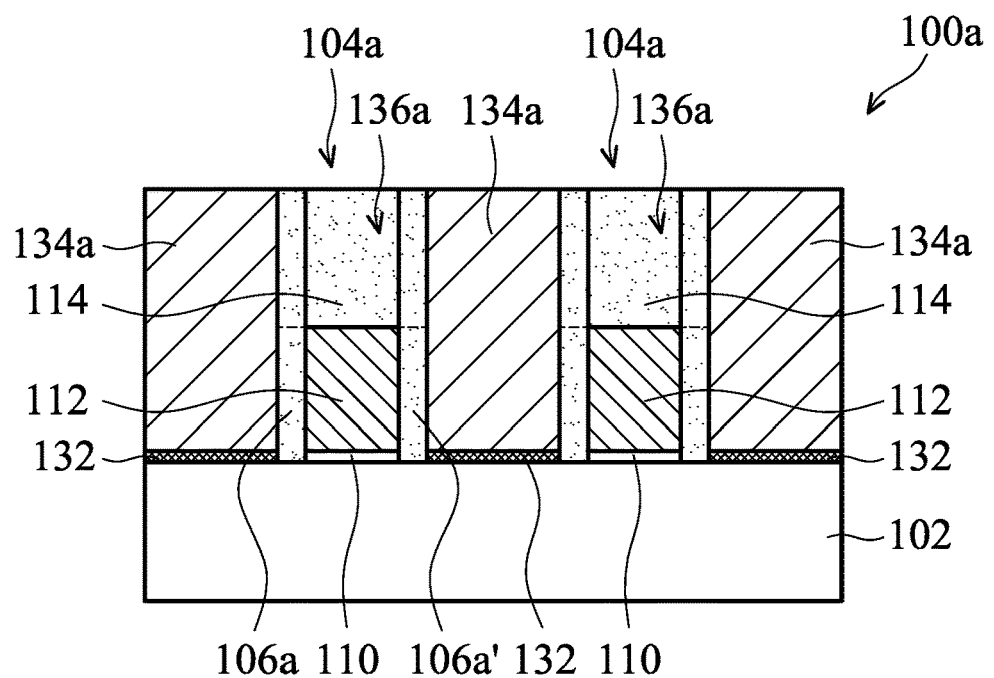

After silicide layer 132 is formed, contacts 134a are formed over silicide layer 132 in trenches 130a, as shown in FIG. 1F in accordance with some embodiments. In some embodiments, contact 132 includes a conductive material, such as aluminum (Al), copper (Cu), tungsten (W), titanium (Ti), tantalum (Ta), titanium nitride (TiN), tantalum nitride (TaN), nickel silicide (NiS), cobalt silicide (CoSi), tantulum carbide (TaC), tantulum silicide nitride (TaSiN), tantalum carbide nitride (TaCN), titanium aluminide (TiAl), titanium aluminide nitride (TiAlN), other applicable conductive materials, or a combination thereof.

In addition, contact 134a may further include a liner and/or a barrier layer. For example, a liner (not shown) may be formed on the sidewalls and bottom of the contact trench. The liner may be either tetraethylorthosilicate (TEOS) or silicon nitride, although any other applicable dielectric may alternatively be used. The liner may be formed using a plasma enhanced chemical vapor deposition (PECVD) process, although other applicable processes, such as physical vapor deposition or a thermal process, may alternatively be used. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

As shown in FIG. 1F, contact 134a and gate structure 104a are separated by first spacer 106a and second spacer 106a'. In addition, insulating layer 114 and first spacer 106a and second spacer 106a' formed over the sidewalls of insulating layer 114 can be seen as an insulating structure 136a formed over gate electrode layer 112. As described previously, during the formation of semiconductor structure 100a, hard mask structure 120 is formed over gate structure 104a (e.g. over insulating structure 136a), and first extending portion 124 and second extending portion 126 are formed over the upper portions of first spacer 106a and second spacer 106a' respectively (e.g. over the sidewalls of insulating structure 136a). Accordingly, gate electrode layer 112 can be better protected in subsequent processes, such as etching processes. Therefore, the risk of leakage between gate electrode layer 112 and contact 134a can be reduced.

Figure 2A:
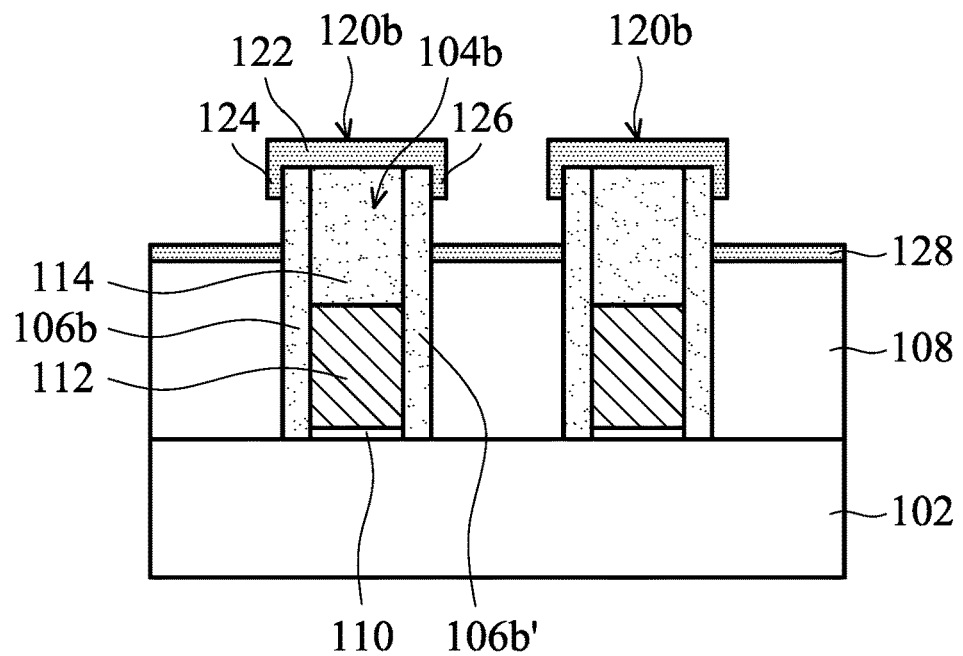
FIGS. 2A to 2C are cross-sectional representations of various stages of forming a semiconductor structure in accordance with some embodiments.
Figure 2B:
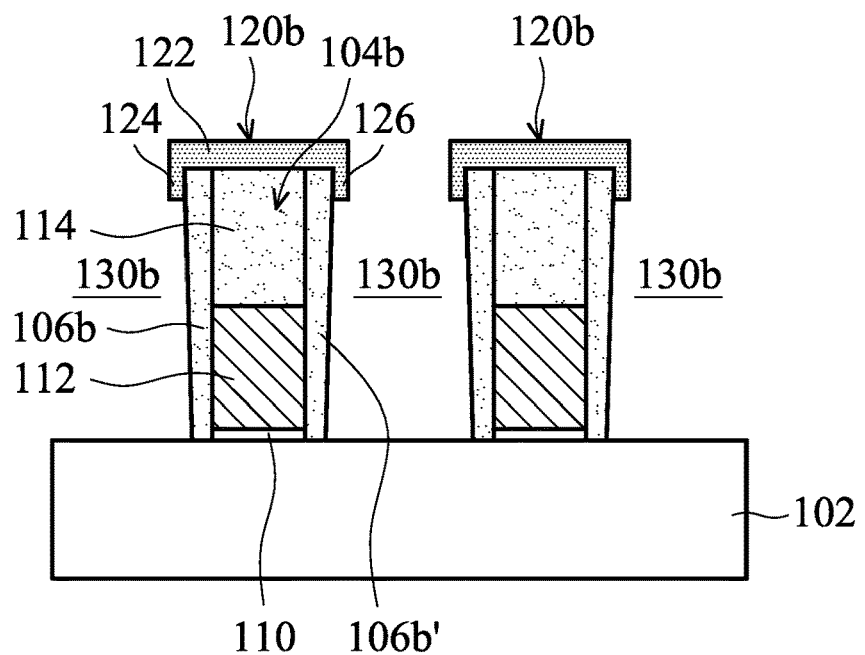
Figure 2C:
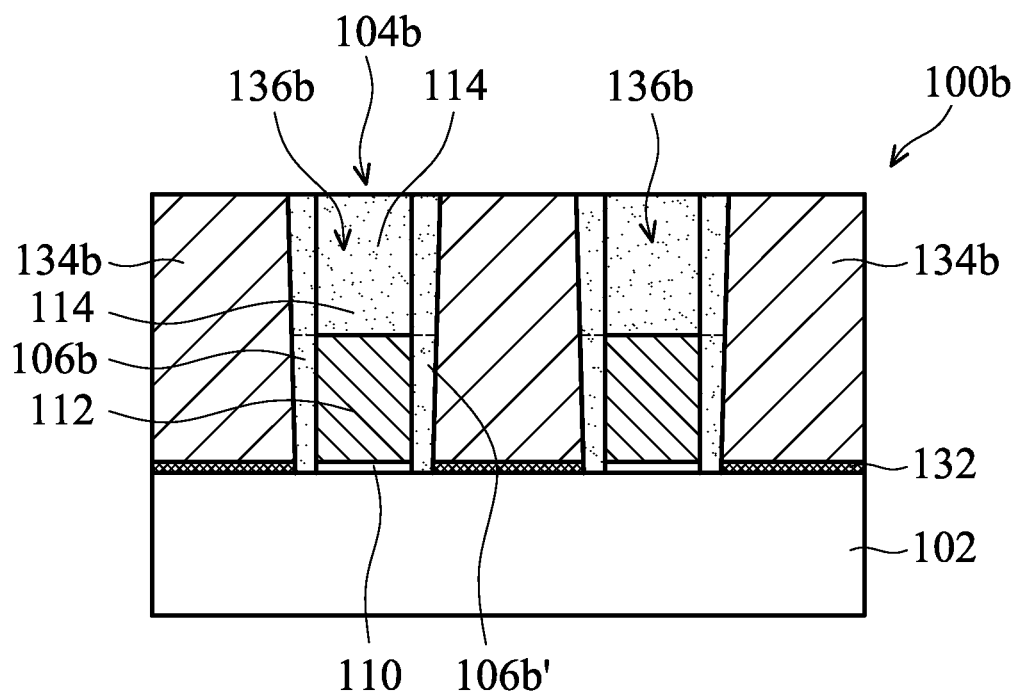

FIGS. 2A to 2C are cross-sectional representations of various stages of forming a semiconductor structure 100b in accordance with some embodiments. The processes and materials used to form semiconductor structure 100b may be similar to, or the same as, those used to form semiconductor structure 100a as shown in FIGS. 1A to 1F and described above and are not repeated herein.

As shown in FIG. 2A, gate structures 104b are formed over substrate 102, and gate structures 104b include gate dielectric layer 110 formed over substrate 102, gate electrode layer 112 formed over gate dielectric layer 110, and insulating layer 114 formed over gate electrode layer 112. In addition, a first spacer 106b and a second spacer 106b' are formed over the sidewalls of gate structures 104b, as shown in FIG. 2A in accordance with some embodiments.

Next, interlayer dielectric layer 108 is formed around gate structures 104b over substrate 102. A top portion of interlayer dielectric layer 108 is removed to expose a portion of gate structure 104b. After the top portion of interlayer dielectric layer 108 is removed, hard mask structures 120b are formed over gate structures 104b, as shown in FIG. 2A in accordance with some embodiments.

Similar to that shown in FIG. 1C and described previously, hard mask structure 120b includes main portion 122, first extending portion 124, and second extending portion 126. More specifically, main portion 122 of hard mask structure 120b is formed over the top surface of gate structure 104b (i.e. the top surface of insulating layer 114). In addition, first extending portion 124, which is connected to one side of the main portion 122, extends onto the upper portion of first sidewall 106b but not to the bottom portion of first sidewall 106b, and second extending portion 126, which is connected to another side of the main portion 122, extends onto the upper portion of second sidewall 106b' but not to the bottom portion of second sidewall 106b'. Processes and materials used to form hard mask structure 120b are similar to, or the same as, those used to form hard mask structure 120a and are not repeated herein.

After hard mask structure 120b is formed, portions of interlayer dielectric layer 108 are removed to form trenches 130b, as shown in FIG. 2B in accordance with some embodiments. It should be noted that, although interlayer dielectric layer 108 seems to be completely removed in FIG. 2B, it only shows a cross-sectional representation of the structure. In other portions of the structure, some portions of interlayer dielectric layer 108 remain around gate structures 104b.

In some embodiments, trenches 130b are formed by performing an etching process. In addition, during the etching process, portions of first spacer 106b and second spacer 106b' are removed in accordance with some embodiments. As described previously, first extending portion 124 and second extending portion 126 are formed over the upper portions of first spacer 106b and second spacer 106b' respectively. Therefore, the upper portions of first spacer 106b and second spacer 106b' may be better protected by hard mask structure 120b while some portions of first spacer 106b and second spacer 106b' not covered by hard mask structure 120b may be etched. In some embodiments, a portion of first spacer 106b not covered by first extending portion 124 of hard mask structure 120b is removed, such that the upper portion of first spacer 106b is wider than the bottom portion of first spacer 106b, as shown in FIG. 2B.

Similarly, a portion of second spacer 106b' not covered by second extending portion 126 of hard mask structure 120b is removed, such that the upper portion of second spacer 106b' is wider than the bottom portion of second spacer 106b', as shown in FIG. 2B in accordance with some embodiments. The difference between the width of the upper portion of first spacer 106b and the width of the bottom portion of first spacer 106b may be controlled to prevent the increase of the risk of forming a short circuit.

As shown in FIG. 2B, since some bottom portions of first spacer 106b and second spacer 106b' are removed, the width of the upper portion of trench 130b is smaller than the width of the bottom portion of trench 130b in accordance with some embodiments. After trenches 130b are formed, hard mask structures 120b are removed, as shown in FIG. 2C in accordance with some embodiments. Afterwards, silicide layer 132 is formed over the bottom surface of trenches 130b, and contacts 134b are formed in trenches 130b over silicide layer 132, as shown in FIG. 2C in accordance with some embodiments. Processes and materials used to form contacts 134b are similar to, or the same as, those used to form contacts 134a and are not repeated herein.

In addition, since trench 130b has a wider bottom portion, contact 134b formed in trench 130b also may have a wider bottom portion. In some embodiments, the width of the upper portion of contact 134b (e.g. the width of the top surface of contact 134b) is smaller than the width of the bottom portion of contact 134b (e.g. the width of the bottom surface of contact 134b).

As shown in FIG. 2C, contacts 134b and gate structures 104b are separated by first spacer 106b and second spacer 106b'. In addition, insulating layer 114 and first spacer 106b and second spacer 106b' formed over the sidewalls of insulating layer 114 can be seen as an insulating structure 136b formed over gate electrode layer 112. As described previously, during the formation of semiconductor structure 100b, hard mask structure 120b is formed over gate structure 104b (e.g. over insulating structure 136b), and first extending portion 124 and second extending portion 126 are formed over the upper portions of first spacer 106b and second spacer 106b' respectively (e.g. over the sidewalls of insulating structure 136b). Accordingly, gate electrode layer 112 can be better protected in subsequent processes, such as etching processes. Therefore, the risk of forming a short circuit between gate electrode layer 112 and contact 134b can be reduced.

Furthermore, as shown in FIG. 2C, some portions of first spacer 106b and second spacer 106b' are removed, such that the width of the upper portion of first spacer 106b (e.g. the width of the top surface of first spacer 106b) is greater than the width of the bottom portion of first spacer 106b' (e.g. the width of the bottom surface of first spacer 106b) in accordance with some embodiments.

As described previously, insulating layer 114 and first spacer 106b and second spacer 106b' formed over the sidewalls of insulating layer 114 can be seen as an insulating structure 136b formed over gate electrode layer 112. As shown in FIG. 2C, the upper portion of insulating structure 136b is wider than the bottom portion of insulating structure 136b in accordance with some embodiments. That is, the width of the upper portion of insulating structure 136b (e.g. the width of the top surface of insulating structure 136b) is larger than the width of the bottom portion of insulating structure 136b (e.g. the width of the bottom surface of insulating structure 136b) in accordance with some embodiments. In some embodiments, a ratio of the width of the upper portion of insulating structure 136b to the width of the bottom portion of insulating structure 136b is greater than 1, such as in a range from about 1.01 to about 1.2.

It should be noted that the methods including using hard mask structures, such as hard mask structures 120a and 120b, may be applied to various applications. For example, the hard mask structures may be used to form a semiconductor structure having gate structures spaced apart from one another in various distances.

Figure 3A:
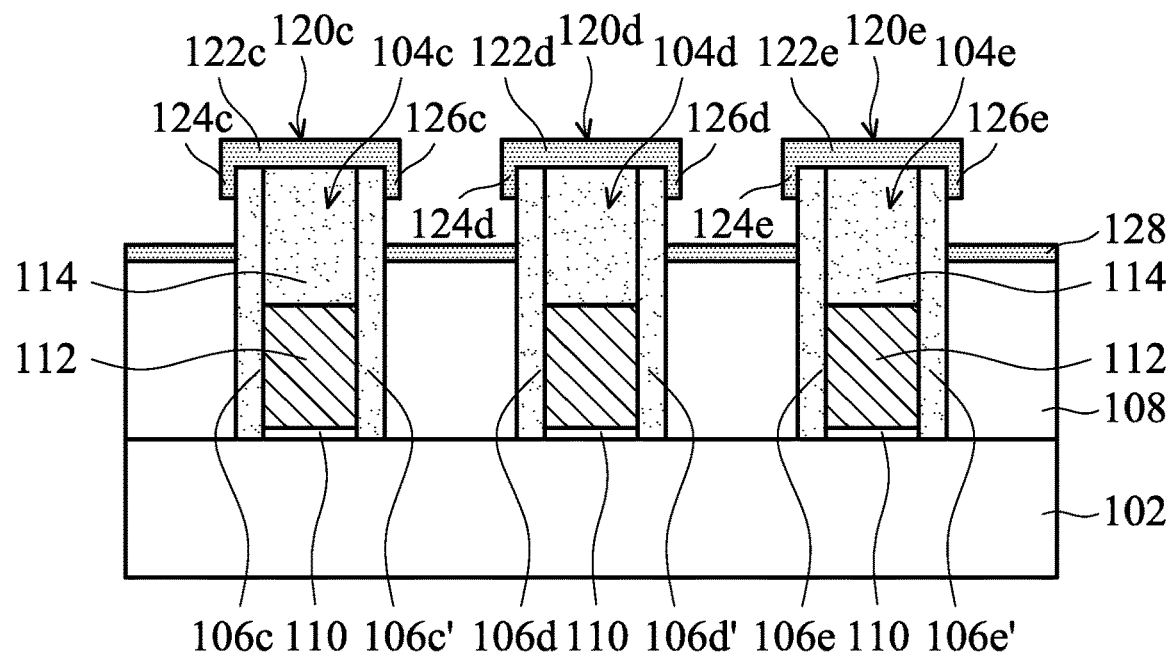
FIGS. 3A to 3B are cross-sectional representations of a semiconductor structure in accordance with some embodiments.
Figure 3B:
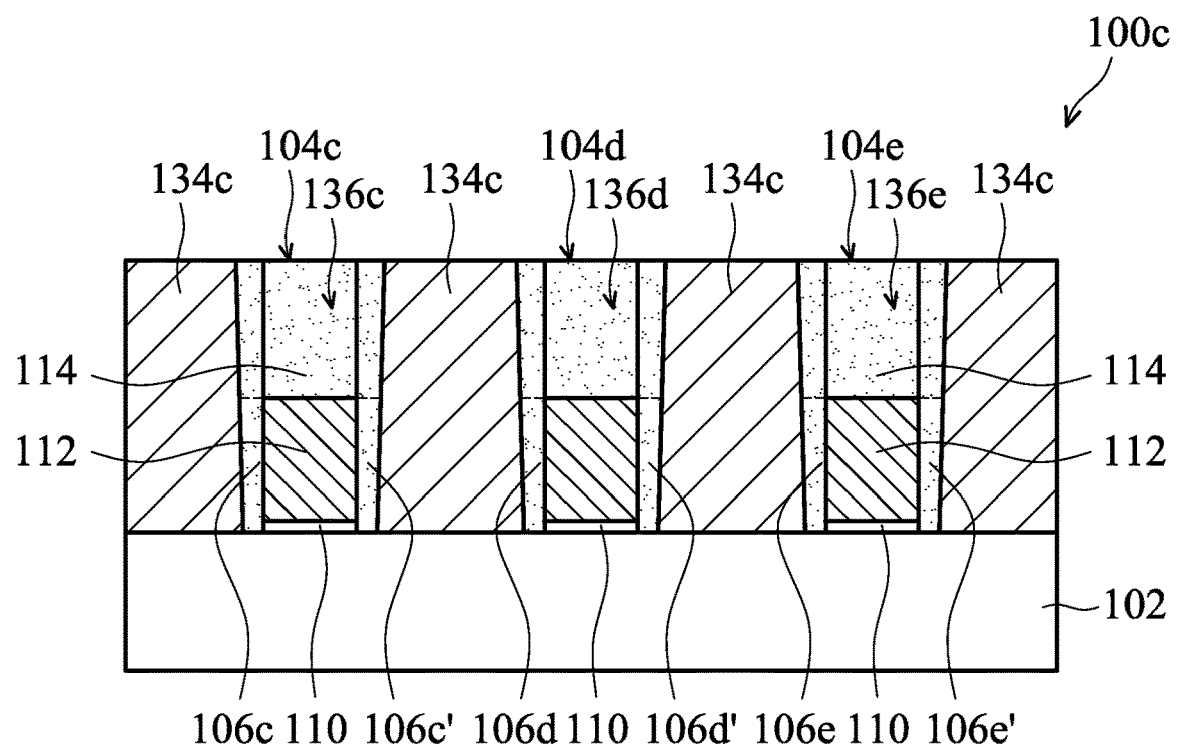

FIGS. 3A to 3B are cross-sectional representations of a semiconductor structure 100c in accordance with some embodiments. Semiconductor structure 100c is similar to semiconductor structures 100a and 100b described above. Processes and materials used to form semiconductor structure 100c may be similar to, or the same as, those used to form semiconductor structures 100a and 100b and are not repeated herein.

More specifically, a first gate structure 104c, a second gate structure 104d, and a third gate structure 104e are formed over substrate 102, as shown in FIG. 3A in accordance with some embodiments. In addition, the distance between first gate structure 104c and second gate structure 104d is different from the distance between second gate structure 104d and third gate structure 104e in accordance with some embodiments. The distance between two gate structures may be defined as the distance between the sidewalls of two adjacent gate structures measured in a direction parallel to the top surface of substrate 102.

Similar to gate structures 104a and 104b, first gate structure 104c, second gate structure 104d, and third gate structure 104e each includes gate dielectric layer 110 formed over substrate 102, gate electrode layer 112 formed over gate dielectric layer 110, and insulating layer 114 formed over gate electrode layer 112. In addition, a first spacer 106c and a second spacer 106c' are formed on the sidewalls of first gate electrode structure 104c. A first spacer 106d and a second spacer 106d' are formed on the sidewalls of second gate electrode structure 104d. A first spacer 106e and a second spacer 106e' are formed on the sidewalls of third gate electrode structure 104e.

After first gate structure 104c, second gate structure 104d, and third gate structure 104e are formed, interlayer dielectric layer 108 is formed around first gate structure 104c, second gate structure 104d, and third gate structure 104e. In addition, a first hard mask structure 120c is formed over first gate structure 104c, a second hard mask structure 120d is formed over second gate structure 104d, and a third mask structure 120e is formed over third gate structure 104e, as shown in FIG. 3A in accordance with some embodiments. First hard mask structure 120c includes a main portion 122c, a first extending portion 124c, and a second extending portion 126c. Similarly, second hard mask structure 120d includes a main portion 122d, a first extending portion 124d, and a second extending portion 126d, and third hard mask structure 120e includes a main portion 122e, a first extending portion 124e, and a second extending portion 126e.

In some embodiments, first hard mask structure 120c, second hard mask structure 120d, and third hard mask structure 120e are formed by performing a physical vapor deposition process. In some embodiments, first hard mask structure 120c, second hard mask structure 120d, and third hard mask structure 120e are formed by performing a plasma spray physical vapor deposition process. As described previously, the plasma may be sprayed to the gate structures 104c to 104e in a first direction, and an angle between the first direction and the top surface of the gate structures is in a range from about 30° to about 85°. When the plasma is sprayed to gate structures in the first direction, which is not vertical to the top surface of substrate 102, it can prevent the lengths of first extending portions 124c to 124e and second extending portions 126c to 126e from being affected by the spacing between the adjacent gate structures. Accordingly, the length of first extending portions 124c to 124e and second extending portions 126c to 126e may be easier to control.

Therefore, even if the distances between first gate structure 104c and second gate structure 104d and between second gate structure 104d and third gate structure 104e are different, the lengths of their extending portions can still be substantially equal. Accordingly, in substantial manufacturing processes, such as forming trenches between first gate structure 104c, second gate structure 104d, and third gate structure 104e, their gate electrode layers 110 can be better and more equally protected by first hard mask structure 120c, second hard mask structure 120d, and third hard mask structure 120e.

In some embodiments, the length of first extending portion 124c of first hard mask structure 120c, the length of first extending portion 124d of second hard mask structure 120d, and the length of first extending portion 124e of third hard mask structure 120e are substantially equal.

After first hard mask structure 120c, second hard mask structure 120d, and third hard mask structure 120e are formed, portions of interlayer dielectric layer 108 are etched to form trenches, and first hard mask structure 120c, second hard mask structure 120d, and third hard mask structure 120e are removed. In addition, some portions of first spacers 106c to 106e and second spacers 106c' to 106e' are also etched during the formation of the trenches in accordance with some embodiments. Accordingly, an insulating structure 136c, including insulating layer 114 and first spacer 106c and second spacer 106c' formed on the sidewalls of insulating layer 114, formed over gate electrode layer 112 has a wider upper portion and a narrower bottom portion in accordance with some embodiments. In addition, first spacer 106c and second spacer 106c' each have a wider upper portion and a narrower bottom portion in accordance with some embodiments.

Similarly, an insulating structure 136d, including insulating layer 114 and first spacer 106d and second spacer 106d' formed on the sidewalls of insulating layer 114, formed over gate electrode layer 112 has a wider upper portion and a narrower bottom portion in accordance with some embodiments. In addition, first spacer 106d and second spacer 106d' each have a wider upper portion and a narrower bottom portion in accordance with some embodiments.

Similarly, an insulating structure 136e, including insulating layer 114 and first spacer 106e and second spacer 106e' formed on the sidewalls of insulating layer 114, formed over gate electrode layer 112 has a wider upper portion and a narrower bottom portion in accordance with some embodiments. In addition, first spacer 106e and second spacer 106e' each have a wider upper portion and a narrower bottom portion in accordance with some embodiments.

Next, silicide layer 132 and contacts 134 are formed in the trenches between first gate structure 104c, second gate structure 104d, and third gate structure 104e over substrate 102 between first gate structure 104c, second gate structure 104d, and third gate structure 104e, similar to the processes shown in FIGS. 1D to 1F. As described previously, since the lengths of first extending portions 124c, 124d, and 124e and second extending portions 126c, 126d, and 126e are formed and controlled, the risk of a short circuit may be reduced.

The methods for forming hard mask structures described above may be used to form other structures in various applications. For example, a contact etched stop layer may be formed by processes that are similar to those described previously. FIGS. 4A to 4E are cross-sectional representations of various stages of forming a semiconductor structure 100f in accordance with some embodiments. In the formation of semiconductor structure 100f, a contact etch stop layer is formed using the processes and materials used to form hard mask structures 120a to 120e described previously. The processes and materials used to form semiconductor structure 100f which is similar to, or the same as, those used to form semiconductor structures 100a to 100c are not repeated herein.

Figure 4A:
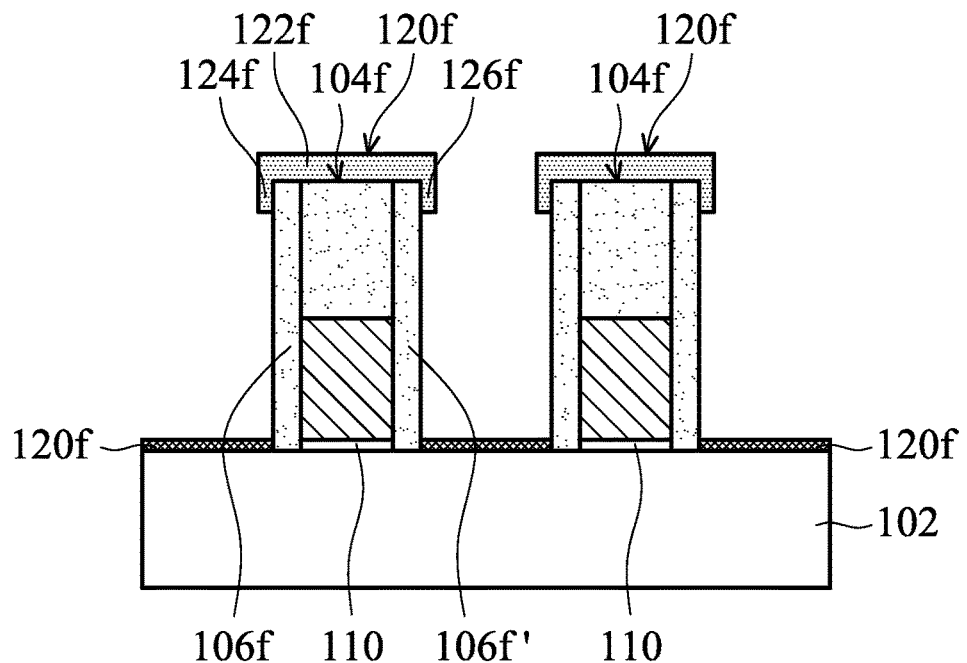
FIGS. 4A to 4E are cross-sectional representations of various stages of forming a semiconductor structure in accordance with some embodiments.

More specifically, gate structures 104f are formed over substrate 102, as shown in FIG. 4A in accordance with some embodiments. Gate structure 104f includes a gate dielectric layer 110, a gate electrode layer 112, and an insulating layer 114 in accordance with some embodiments. After gate structures 104f are formed, a first spacer 106f and a second spacer 106f' are formed over the sidewalls of gate structures 104f.

Next, a contact etch stop layer 120f is formed over gate structure 104f, as shown in FIG. 4A in accordance with some embodiments. In some embodiments, contact etch stop layer 120f includes a main portion 122f, a first extending portion 124f, and a second extending portion 126f. More specifically, main portion 122f of contact etch stop layer 120f is formed over the top surface of gate structure 104f (i.e. the top surface of insulating layer 114). In addition, first extending portion 124f, which is connected to one side of the main portion 122f, extends onto the upper portion of first spacer 106f but not to the bottom portion of first spacer 106f; and second extending portion 126f, which is connected to another side of the main portion 122f, extends onto the upper portion of second spacer 106f' but not to the bottom portion of second spacer 106f'.

In some embodiments, contact etch stop layer 120f is made of TiN. In some embodiments, contact etch stop layer 120f is formed by performing a physical vapor deposition process. In some embodiments, contact etch stop layer 120f is formed by performing a plasma spray physical vapor deposition process. In some embodiments, plasma is used to spray to gate structure 104f in the physical vapor deposition process. The plasma is sprayed to gate structure 104f in a first direction, and an angle between the first direction and the top surface of gate structure 104f is in a range from about 30° to about 85°. When the plasma is sprayed to gate structure 104f in the first direction, which is not vertical to the top surface of substrate 102, the lengths of first extending portion 124f and second extending portion 126f of contact etch stop layer 120f may be easier to control. In some embodiments, contact etch stop layer 120f is further formed over substrate 102, as shown in FIG. 4A in accordance with some embodiments.

Figure 4B:
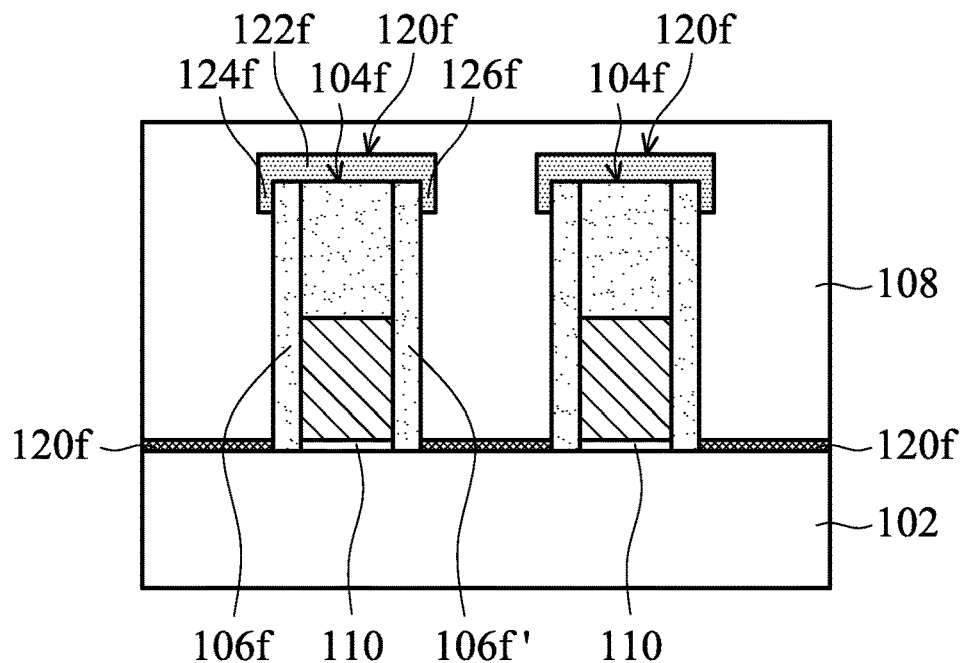
Figure 4C:
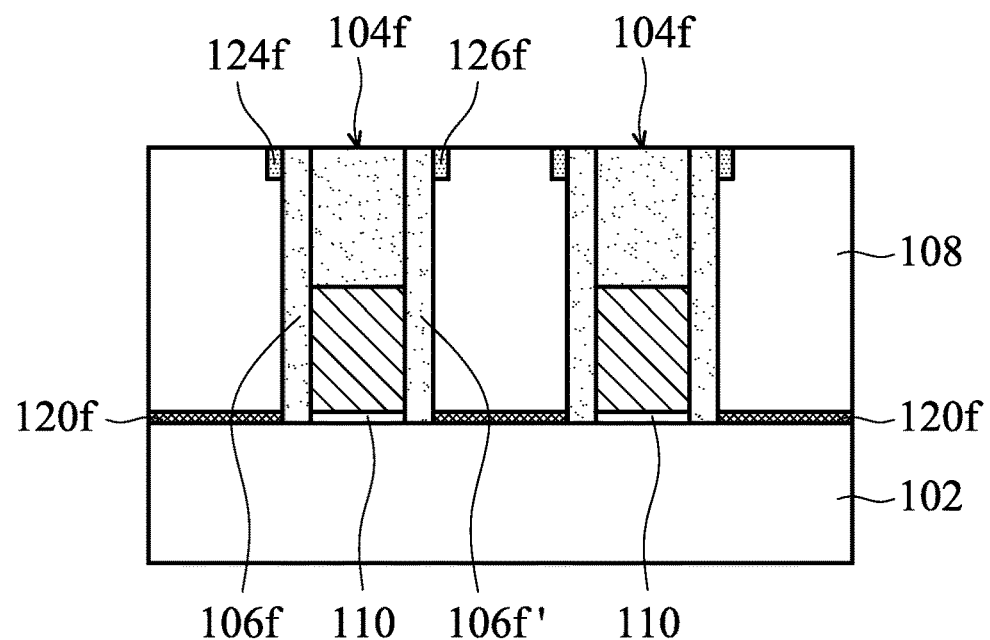
Figure 4D:
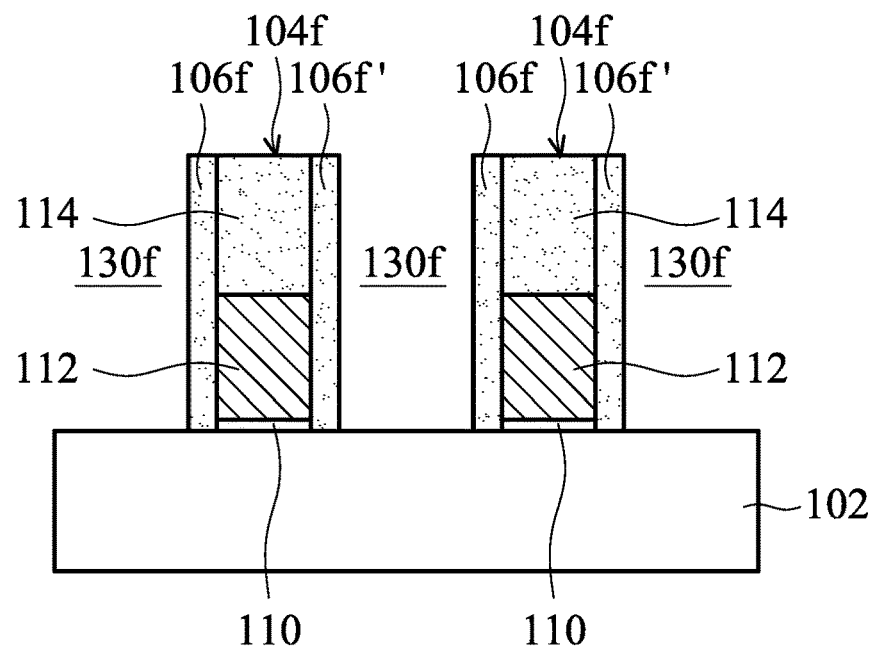
Figure 4E:
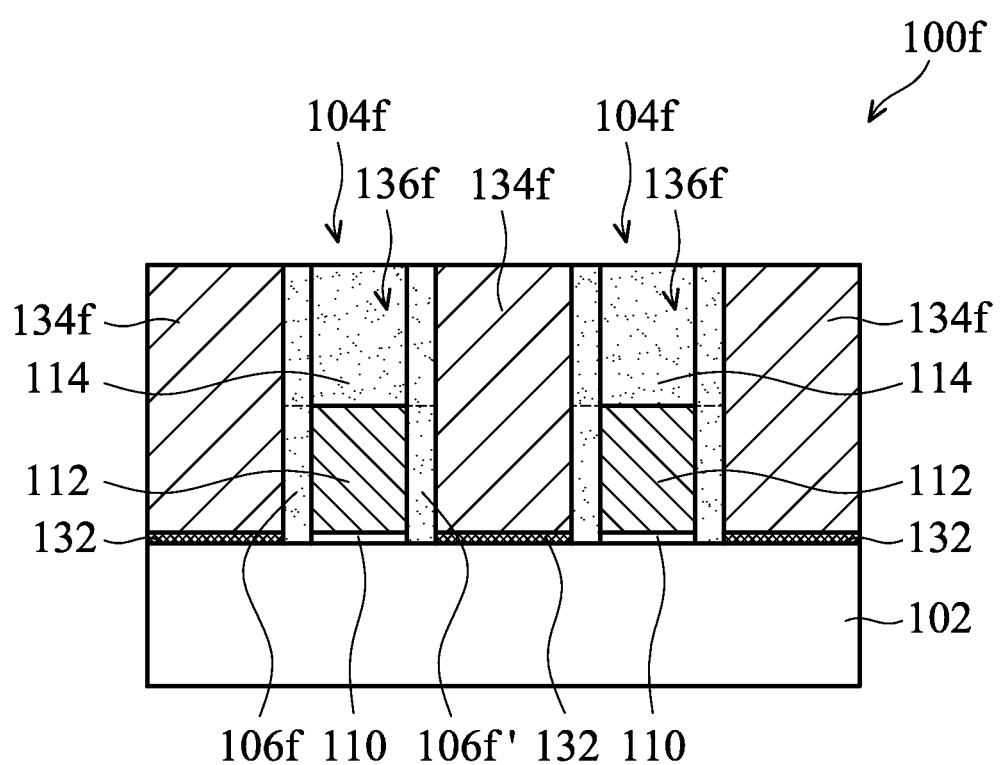

After contact etch stop layer 120f is formed, interlayer dielectric layer 108 is formed around gate structures 104s over substrate 102, as shown in FIG. 4B in accordance with some embodiments. Next, a polishing process is performed to expose the top surface of gate structures 104f, as shown in FIG. 4C in accordance with some embodiments. Afterwards, portions of interlayer dielectric layer 108 are removed to form trenches 130f, as shown in FIG. 4D in accordance with some embodiments. After trenches 103f are formed, silicide layer 132 is formed over a bottom surface of trench 130f and contacts 134f are formed over silicide layer 132, as shown in FIG. 1E in accordance with some embodiments.

Generally, in a semiconductor structure, gate structures may be designed to be located at various positions, and the distance between them may be different. Therefore, when contacts are formed in the spaces between the gate structures, the uniformity of forming the contacts may be poor due to the patterned difference. For example, when a distance between two gate structures is relatively large, a great amount of hard mask structure may be formed. On the other hand, when a distance between two gate structures is relatively small, only a small amount of hard mask structure may be formed. Accordingly, the uniformity may be poor due to the pattern's difference, and the risk of short circuit between the gate structures and the contacts may increase.

Accordingly, in some embodiments, hard mask structures are formed, so that the risk of short circuit may be reduced. In some embodiments, hard mask structures (e.g. hard mask structures 120a to 120e) are formed over gate structures (e.g. gate structures 104a to 104e) to protect the gate structures in the subsequent manufacturing processes, such as etching processes. In addition, each hard mask structure may include a first extending portion (e.g. first extending portions 124) and a second extending portion (e.g. second extending portion 126) extending onto the upper portion of the spacers (e.g. first spacers 106a to 106e and second spacers 106a' to 106e') formed over the sidewalls of the gate structure. The formation of the extending portions may enable better protection of the gate electrode layer (e.g. gate electrode layer 112) in the gate structure. Therefore, the risk of gate structure leakage may be reduced.

In addition, the first extending portion and the second extending portion may be formed by spraying plasma in a direction not vertical to the top surface of the gate structure (e.g. in the first direction described previously). Therefore, the lengths of the first extending portion and the second extending portion may be precisely controlled. For example, the length of the first extending portion and the length of the second extending portion may be substantially equal, even if the spacing on two sides of the gate structure are different.

Furthermore, the extending portions of the hard mask structures formed on different gate structures (e.g. first extending portions 124c to 124e) may also have substantially equal length. Accordingly, in subsequent etching processes, the gate structures can be uniformly protected, and the risk of the leakage of the gate structures is reduced.

Embodiments of semiconductor structures and methods for manufacturing the same are provided. The method for forming the semiconductor structure includes forming a hard mask structure over a gate structure, and the hard mask structure includes a first extending portion and a second extending portion. The first extending portion and the second extending portion extend onto spacers formed over the gate structure. The length of the first extending portion and the second extending portion can be controlled to protect the gate structure in subsequent manufacturing processes. Therefore, the yield of the manufacturing processes may be improved.

In some embodiments, a method for manufacturing a semiconductor structure is provided. The method for manufacturing a semiconductor structure includes forming a gate structure over a substrate and forming a spacer on a sidewall of the gate structure. The method for manufacturing a semiconductor structure further includes forming a hard mask structure on a top surface of the gate structure and on an upper portion of the spacer but not on a bottom portion of the spacer.

In some embodiments, a method for manufacturing a semiconductor structure is provided. The method for manufacturing a semiconductor structure includes forming a first gate structure over a substrate and forming a first spacer and a second spacer over sidewalls of the first gate structure. The method for manufacturing a semiconductor structure further includes forming a first hard mask structure over the first gate structure. In addition, the first hard mask structure comprises a first extending portion extending onto an upper portion of the first spacer and a second extending portion extending onto an upper portion of the second spacer.

In some embodiments, a semiconductor structure is provided. The semiconductor structure includes a substrate and a first gate electrode layer formed over the substrate. The semiconductor structure further includes a first insulating structure formed over the first gate electrode layer. In addition, an upper portion of the first insulating structure is wider than a bottom portion of the first insulating structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a gate structure over a substrate, wherein the gate structure comprises a gate electrode layer and an insulating layer above the gate electrode layer;
   forming a spacer on a sidewall of the gate electrode layer and a sidewall of the insulating layer;
   forming an interlayer dielectric layer around the gate structure over the substrate;
   etching a top portion of the interlayer dielectric layer to expose a top surface of the insulating layer and an upper portion of a sidewall of the spacer;
   forming a hard mask structure on the exposed top surface of the insulating layer of the gate structure and on the exposed upper portion of the sidewall of the spacer but not on a bottom portion of the sidewall the spacer; and
   etching the interlayer dielectric layer and the bottom portion of the sidewall of the spacer not covered by the hard mask structure while the top surface of the insulating layer of the gate structure and the upper portion of the sidewall of the spacer are covered by the hard mask structure.

2. The method for manufacturing the semiconductor structure as claimed in claim 1, wherein the hard mask structure is formed by performing a plasma spray physical vapor deposition process.

3. The method for manufacturing the semiconductor structure as claimed in claim 2, wherein plasma is sprayed onto the top surface of the gate structure in a first direction in the plasma spray physical vapor deposition process, and an angle between the first direction and the top surface of the gate structure is in a range from 30° to 85°.

4. The method for manufacturing a semiconductor structure as claimed in claim 1, further comprising:
   forming a hard mask layer on a top surface of the interlayer dielectric layer,
   wherein a thickness of the hard mask structure is greater than a thickness of the hard mask layer.

5. The method for manufacturing a semiconductor structure as claimed in claim 4, wherein the hard mask layer is not in contact with the hard mask structure.

6. The method for manufacturing a semiconductor structure as claimed in claim 1, wherein the hard mask structure is not in direct contact with the interlayer dielectric layer.

7. The method for manufacturing a semiconductor structure as claimed in claim 1, wherein a first width at the upper portion of the sidewall of the spacer is greater than a second width at the bottom portion of the sidewall of the spacer, and the first width and the second width are measured along a same direction parallel to a top surface of the substrate.

8. A method for manufacturing a semiconductor structure, comprising:
   forming a first gate structure over a substrate;
   forming a first spacer on a sidewall of the first gate structure;
   forming an interlayer dielectric layer around the first gate structure over the substrate;
   forming a first hard mask structure on a top surface of the first gate structure and on a top surface and an upper portion of a sidewall of the first spacer but not on a bottom portion of the sidewall of the first spacer after forming the interlayer dielectric layer; and
   forming a hard mask layer over a top surface of the interlayer dielectric layer without in direct contact with the first hard mask structure, wherein a top surface of the hard mask layer is lower than a bottom surface of the first hard mask structure,
   wherein the first hard mask structure is formed by performing a plasma spray physical vapor deposition process and plasma is sprayed onto the top surface of the gate structure in a first direction in the plasma spray physical vapor deposition process, and an angle between the first direction and the top surface of the gate structure is in a range from 30° to 85°, and wherein the first hard mask structure is in direct contact with the top surface and the upper portion of the sidewall of the first spacer.

9. The method for manufacturing the semiconductor structure as claimed in claim 8, wherein the first hard mask structure comprises a first extending portion extending onto an upper portion of the first spacer and a second extending portion extending onto an upper portion of a second spacer and a length of the first extending portion is substantially equal to a length of the second extending portion.

10. The method for manufacturing the semiconductor structure as claimed in claim 8, wherein the first hard mask structure is made of TiN.

11. The method for manufacturing a semiconductor structure as claimed in claim 8, wherein the first gate structure comprises a gate electrode layer and an insulating layer formed above the gate electrode layer, and the first hard mask structure is formed on a top surface of the insulating layer after the first spacer is formed.

12. The method for manufacturing a semiconductor structure as claimed in claim 8, wherein a thickness of the first hard mask structure is greater than a thickness of the hard mask layer.

13. The method for manufacturing a semiconductor structure as claimed in claim 8, further comprising:
    removing a portion of the interlayer dielectric layer and a portion of the first spacer not covered by the first hard mask structure to form a trench while the first hard mask structure covers the top surface of the first gate structure and the top surface and the upper portion of the sidewall of the first spacer;
    removing the first hard mask structure after the trench is formed; and
    forming a contact in the trench.

14. A method for manufacturing a semiconductor structure, comprising:
    forming a gate structure over a substrate;
    forming a spacer on a sidewall of the gate structure;
    forming an interlayer dielectric layer around the gate structure;
    performing a polishing process to expose a top surface of the gate structure;
    etching the interlayer dielectric layer such that the interlayer dielectric layer is around a bottom portion of the spacer and a top surface of the interlayer dielectric layer is lower than a topmost surface of the spacer;
    forming a hard mask structure comprising a main portion and an extending portion after forming the interlayer dielectric layer, wherein the main portion is formed on the top surface of the spacer and the extending portion is formed on the upper portion of the spacer;
    forming a trench in the interlayer dielectric layer adjacent to the gate structure;
    etching the bottom portion of the spacer not covered by the hard mask structure while the upper portion of the sidewall of the spacer is covered by the extending portion of first hard mask structure and a top of the gate structure is covered by the main portion of the first hard mask structure; and
    forming a contact in the trench.

15. The method for manufacturing a semiconductor structure as claimed in claim 14, wherein the gate structure comprises:
    a gate electrode layer; and
    an insulating structure formed over the gate electrode layer,
    wherein an upper portion of the insulating structure is wider than a bottom portion of the first insulating structure.

16. The method for manufacturing a semiconductor structure as claimed in claim 14, wherein the hard mask structure is formed by performing a physical vapor deposition process, and plasma is sprayed onto a top surface of the gate structure in a first direction in the physical vapor deposition process, and an angle between the first direction and the top surface of the gate structure is in a range from 30° to 85°.

17. The method for manufacturing a semiconductor structure as claimed in claim 14, wherein a first width at the upper portion of the spacer is greater than a second width at the bottom portion of the spacer, and the first width and the second width are measured along a same direction parallel to a top surface of the substrate.

18. The method for manufacturing a semiconductor structure as claimed in claim 14, wherein the interlayer dielectric layer is in direct contact with the bottom portion of the spacer.

19. The method for manufacturing a semiconductor structure as claimed in claim 14, wherein the main portion of the hard mask structure is in direct contact with the top surface of the spacer and the extending portion of the hard mask structure is in direct contact with the upper portion of the spacer.

20. The method for manufacturing a semiconductor structure as claimed in claim 14, wherein the contact is in direct contact with the spacer.

* * * * *